United States Patent
Petefish et al.

[11] Patent Number: 5,882,459
[45] Date of Patent: Mar. 16, 1999

[54] METHOD FOR ALIGNING AND LAMINATING SUBSTRATES TO STIFFENERS IN ELECTRICAL CIRCUITS

[75] Inventors: William George Petefish; Boydd Piper, both of Eau Claire, Wis.

[73] Assignee: W. L. Gore & Associates, Inc., Newark, Del.

[21] Appl. No.: 745,395

[22] Filed: Nov. 8, 1996

[51] Int. Cl.⁶ .................................................. H05K 03/00
[52] U.S. Cl. ............................................ 156/150; 29/829
[58] Field of Search ...................... 156/150, 151, 156/580, 583.1; 29/829

[56] References Cited

U.S. PATENT DOCUMENTS

| | | | |
|---|---|---|---|
| 3,666,582 | 5/1972 | Kauffman et al. | 156/63 |
| 3,953,566 | 4/1976 | Gore | 264/288 |
| 4,482,516 | 11/1984 | Bowman et al. | 264/127 |
| 4,545,761 | 10/1985 | Cartwright et al. | 432/5 |
| 4,637,850 | 1/1987 | Suzuki et al. | 156/60 |
| 4,705,762 | 11/1987 | Ota el al. | 501/87 |
| 4,925,708 | 5/1990 | Waters | 156/273.1 |
| 4,985,107 | 1/1991 | Conroy et al. | 156/299 |
| 4,985,296 | 1/1991 | Mortimer, Jr. | 428/220 |
| 5,332,463 | 7/1994 | Eberlein et al. | 156/556 |

FOREIGN PATENT DOCUMENTS

| | | |
|---|---|---|
| 0 714 765 | 6/1996 | European Pat. Off. . |
| 0 562 725 | 9/1996 | European Pat. Off. . |
| 41 18 814 | 12/1991 | Germany . |
| 97/24770 | 10/1997 | WIPO . |

*Primary Examiner*—Francis J. Lorin
*Attorney, Agent, or Firm*—Victor M. Genco, Jr.

[57] ABSTRACT

A method and apparatus are provided for aligning and laminating stiffeners to substrates in electrical circuits. Generally, this method includes placing a substrate within an alignment frame or tool; applying an adhesive on the substrate; placing a stiffener on the adhesive to form a chip package; applying sufficient pressure and heat to the package for a sufficient time to cure the adhesive. Another method of the present invention includes placing a substrate within an alignment tool or frame; applying an adhesive on the substrate within the alignment tool; placing a stiffener on the adhesive to form a package; applying sufficient heat and pressure to the package for a sufficient time to tack the stiffener to the substrate; removing the package from the alignment tool or frame; and heating the package for a sufficient time and temperature to cure the adhesive wherein the stiffener enhances rigidity of the package.

9 Claims, 8 Drawing Sheets

METHOD FOR ALIGNING AND LAMINATING SUBSTRATES TO STIFFENERS IN ELECTRICAL CIRCUITS

FIELD OF THE INVENTION

The present invention is related to a method and apparatus for aligning and laminating stiffeners to substrates in electrical circuits. And, more particularly, to a method and apparatus for aligning and laminating substrates using bonding and tack bonding methods.

BACKGROUND OF THE INVENTION

Single and multiple silicon chip packages, or semiconductor chip packages, are used to provide electrical connection between semiconductor chips and other electronic components in an electronic circuit, such as die-to-package or chip-to-board interconnects. These single and multiple chip packages serve as a substrate to securely anchor electronic components and as a pathway for electrical signals.

Newer technologies, such as area array attachment techniques, are driving engineers to design chip packages that more closely match the coefficient of thermal expansion (CTE) of silicon, or otherwise ensure, the reliability of such packages through thermal cycling. Embracing, and in some cases over-riding, these trends is a constant drive in the electronics industry to improve performance and simultaneously reduce cost.

Most conventional single and multiple chip packages are typically constructed from thick, mechanically robust dielectric materials, such as ceramics (e.g., alumina, aluminum nitride, beryllium oxide, cordierite, and mullite) and reinforced organic laminates (e.g., epoxies with woven glass, polyimides with woven glass, and cyanate ester with woven glass). In some cases, materials are combined to produce certain improved properties, for example, a package may have a ceramic base with one or several thin films of polyimides or benzocyclobutane (BCB) disposed thereupon.

The most common single or multiple chip electronic packages are made from injection molded plastics with metal lead frames. Sometimes, these packages include laminated interconnect structures made from materials such as FR-4 and BT resins. Recently, advances have been made with these laminated structures to somewhat increase density and performance, as in the case of laminated ball grid array packages. Such packages employing FR-4 and BT resins have a number of advantages, such as lower cost, wide availability, lower dielectric constant, lower resistivity conduction paths, and lighter weight. Unfortunately, these packages suffer from a multiplicity of shortcomings which detract from their usefulness. These shortcomings include low wiring densities, low via densities, high via capacitance, poor CTE match to silicon, non-flatness, large package size, poor thermal stability, poor thermal conduction, and thick packages. Some of these deficiencies have been addressed with the use of thin film polyimides and/or BCBs on ceramics. These materials have high via and wiring densities, small size, and lower dielectric constant. Despite these advantages, these materials still suffer from many shortcomings including high cost, highly resistive conduction paths, lower characteristic impedance, and processing problems leading to limited manufacturing sources and long lead times.

In an attempt to address the industry need for superior price-performance in single and multiple chip packages, packaging technologies have been developed which are based on thin dielectrics that are not reinforced with glass fibers or other mechanical aids. Examples of these thin dielectrics include thin polyimides and polytetrafluoroethylene (PTFE) based dielectrics, such as ceramic filled PTFE or cyanate ester impregnated porous PTFE. Compared with the conventional materials described hereinabove, these packaging technologies yield superior via and wiring density, extremely low dielectric constants, lower via capacitance, lower resistance, smaller package size, thinner packages, CTE matching over a wide range, lower package weight, greater thermal stability, and higher reliability than competing technologies. In some cases, thin dielectrics are used that contain reinforcing materials such as woven glass. Notwithstanding such advantages, these technologies are impaired by very thin, fragile packages. For example, while typical ceramic packaging has a modulus of elasticity values of $40$–$50 \times 10^6$ psi, a typical modulus for a ceramic filled PTFE based package is only about 100,000 psi. Due to these constraints, packaging made from this material is very difficult to handle and assemble. Mechanical stiffeners are commonly added to thin packages made with these materials to give them the needed mechanical robustness.

However, a shortcoming in previous methods to attach the stiffener to the substrate may have resulted when the substrate and stiffener were not properly aligned. This may have created problems during the downstream chip assembly process such as improper edge registry. Another shortcoming in previous methods may have resulted when the stiffener was not properly adhered to the substrate. This may have also created problems during the downstream chip assembly process, which typically utilizes high temperatures, such as partial delamination of the stiffener from the substrate. The result may have been an adverse effect in thermal and electrical conductance. Also, long term reliability of the chip may have been effected due to temperature cycling.

The foregoing illustrates limitations that may exist in present electronic chip package methods. Thus, it is apparent that it would be advantageous to provide an improved method and apparatus for aligning and laminating stiffeners to substrates directed at overcoming one or more of the limitations set forth above. Accordingly, a suitable alternative is provided including features more fully disclosed hereinafter.

SUMMARY OF THE INVENTION

The present invention provides a method and apparatus for properly aligning and laminating stiffeners to substrates and thus, provides a method and apparatus to properly align and bond stiffeners to substrates without harm to the substrate or integrity of the circuits.

In one aspect of the present invention, an apparatus for aligning and laminating substrates to stiffeners in electrical circuits includes an alignment frame having windows therein, substrates within each window, an adhesive applied to each substrate and a stiffener placed over the adhesive so that each stiffener is bonded to the substrate.

In another embodiment of the present invention, a method for aligning and laminating substrates to stiffeners in electrical circuits comprises the following steps:

a) placing a substrate within an alignment frame or tool;

b) applying an adhesive on the substrate within the alignment frame or tool;

c) placing a stiffener on the adhesive to form a package within the alignment frame or tool; and     d) applying sufficient pressure and heat based on the type of adhesive and geometry of the chip package for a sufficient time so as to cure the adhesive.

In a further embodiment, an apparatus for aligning and laminating substrates includes a press having a heated metal platform and ram, a substrate placed on the platform, an adhesive and stiffener placed on the substrate and an alignment tool.

In a further embodiment of the present invention, the method comprises:

a) placing a substrate within an alignment frame or tool;

b) applying an adhesive on the substrate within the alignment frame or tool;

c) placing a stiffener on the adhesive to form a package within the frame or alignment tool;

d) applying sufficient heat and pressure to the package for a sufficient time to tack the stiffener to the substrate;

e) removing the package from the alignment frame or tool; and f) subsequently, heating the package for a sufficient time and temperature to cure the adhesive.

It is, therefore, a purpose of the present invention to describe a method and apparatus whereby substrates are laminated to a stiffeners without damage to the substrate and thus, avoiding the shortcomings in the prior methods. It is a further purpose of the present invention to provide-an improved method and apparatus for achieving flat laminated substrates with an excellent bond to the stiffeners.

BRIEF DESCRIPTION OF THE DRAWINGS

The foregoing summary, as well as the following detailed description of the embodiments of the invention, will be better understood when read in conjunction with the appended drawings. For purposes of illustrating the invention, there is shown in the drawings one embodiment. It should be understood, however, that the invention is not limited to the precise arrangement and instrumentality shown. In the drawings.

DETAILED DESCRIPTION OF THE INVENTION

Referring now to the drawings, wherein similar reference characters designate corresponding parts throughout the several views. FIGS. 1–6 illustrate methods and apparatus for aligning and laminating substrates to stiffeners. As may be appreciated by one skilled in the art, although FIGS. 1–6 depict an embodiment of the present invention by forming one layer of substrates and stiffeners, any number of layers may be formed utilizing the teaching of the present invention.

FIGS. 2–6 illustrate an embodiment of the present invention by the method of bonding.

Figure 6:
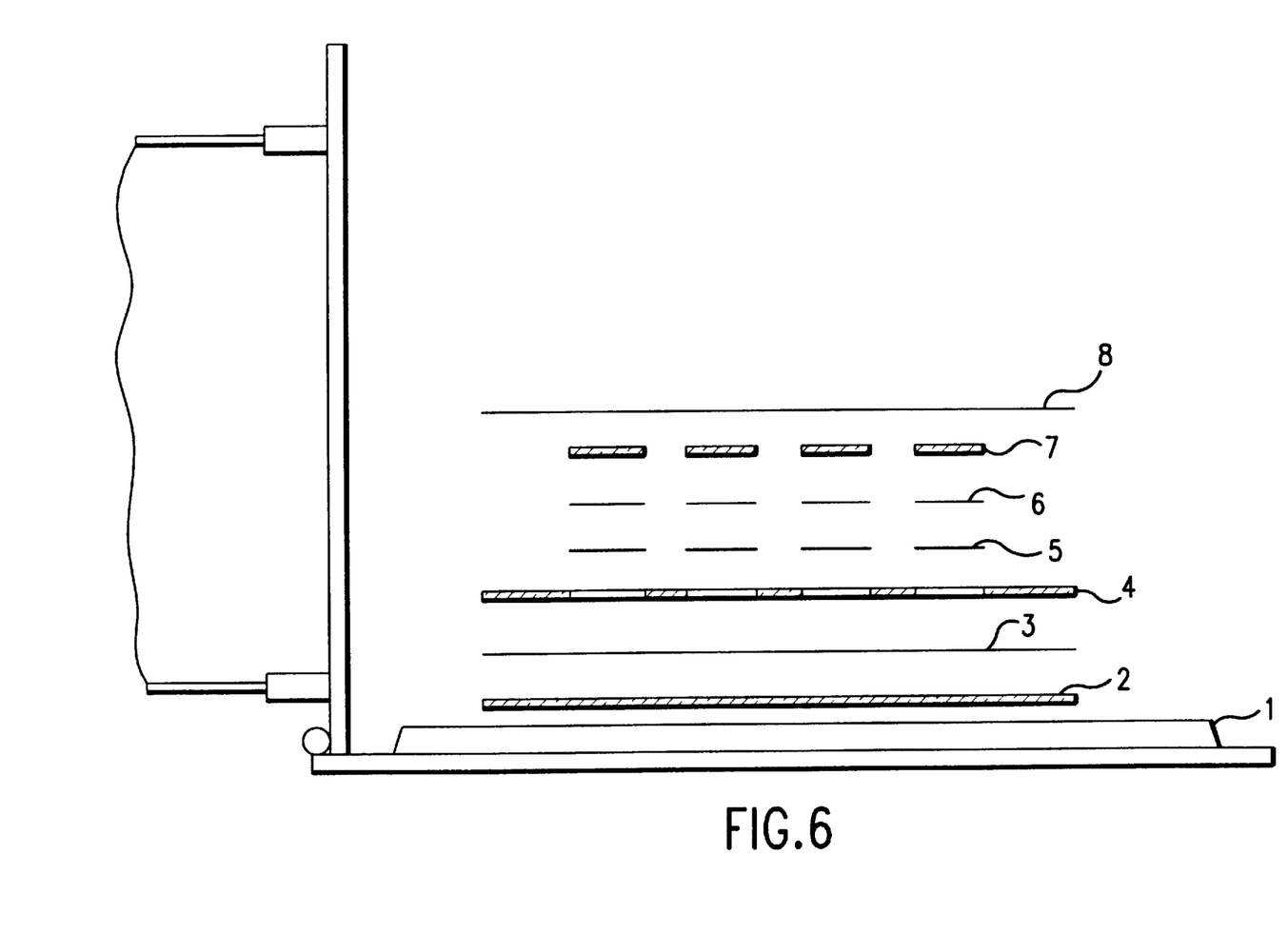
FIG. 6 illustrates an exploded view of one embodiment of the present invention illustrating the alignment frame method and apparatus.

As best illustrated by FIG. 6, a metal base plate 2 is placed on the bottom half of the vacuum frame 1. An interface material 3 is placed atop the base plate 2. The base plate is typically a solid metal plate where the alignment frame and substrates are placed on. The interface material serves to prevent contact of the surfaces of the components to the base or frame. The interface material is a material that typically has the following properties: thin; non-stick; a sufficiently low modulus so as not to damage the chip package; and the ability to withstand processing temperatures required to cure the adhesive. Examples of suitable interface material include thin sheets of polytetrafluoroethylene ("PTFE"), skived PTFE, polyimide and Kapton™ tape. In one embodiment, the interface material 3 is skived PTFE supplied by DeWall Industries, Saundertown, R.I.

Figure 2A:
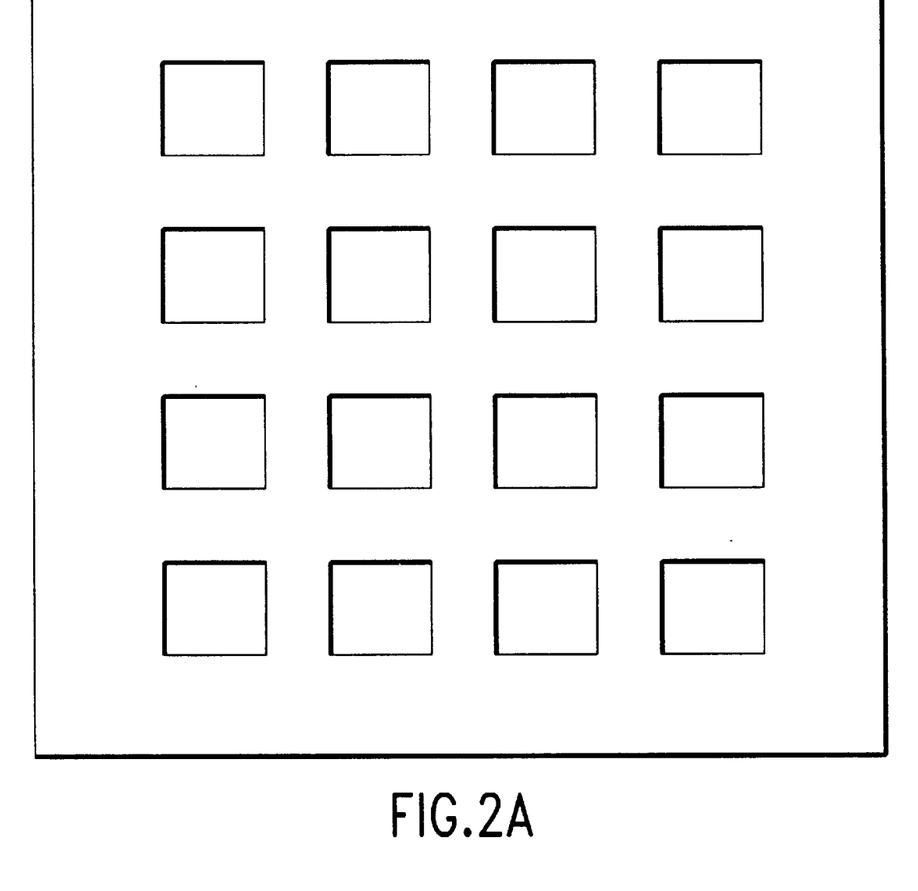
FIGS. 2A and B illustrate a window frame according to the present invention.
Figure 2B:
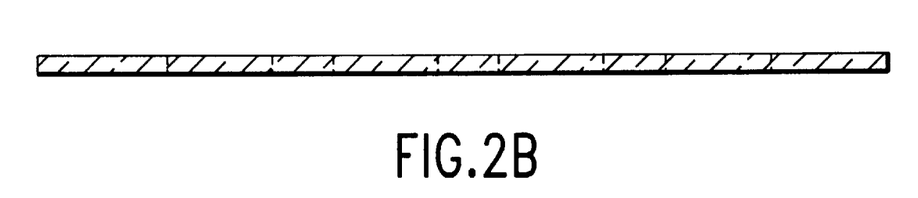

The alignment frame 4 is placed atop the interface material 3. In one embodiment of the present invention, the corners of the frame are taped to the base of the vacuum frame 1 using Kapton™ tape so as to maintain flatness of the alignment frame. As best seen by FIGS. 2A and 2B, where FIG. 2A is a top view and FIG. 2B is a side view, the alignment frame has window openings that are sized to insure that alignment of the finished components meets or exceeds customer specifications. In one embodiment, the openings are sized 0.003" to 0.005" larger than the finished package size. The alignment frame allows parts that contain no internal alignment mechanism, such as tooling holes, to be aligned and bonded. The alignment frame material should have a coefficient of thermal expansion that is equal to or less than the components being bonded, for example, solid copper. The alignment frame's thickness should also be equal to or less than the total thickness of the components being bonded, sufficient to provide alignment of the top component and allow pressure to be applied to the entire package's surface area.

Figure 3A:
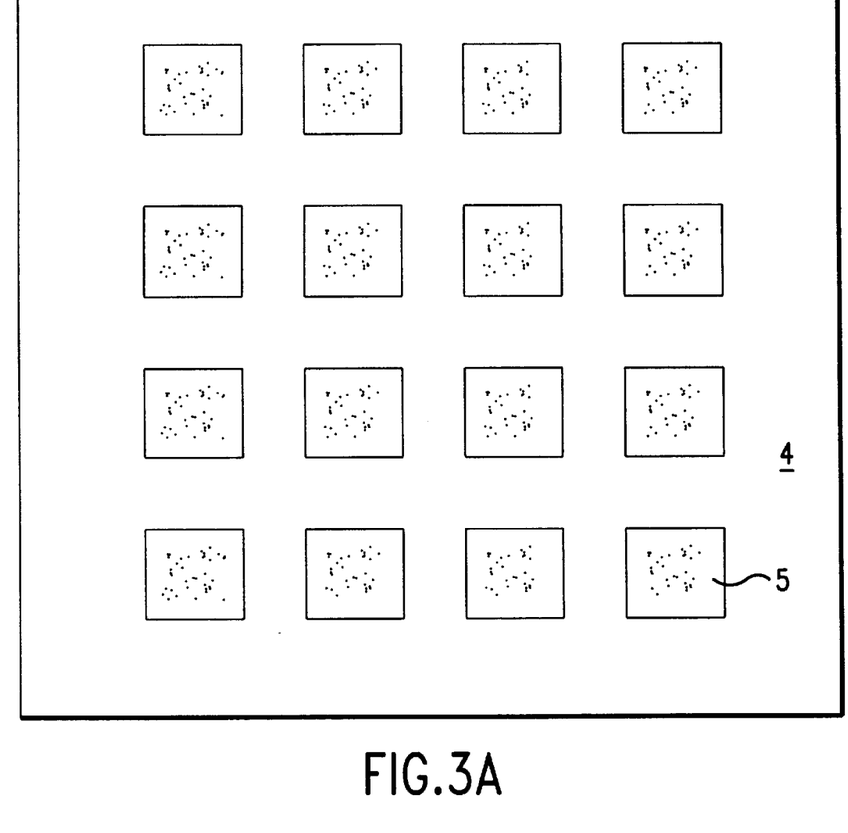
FIGS. 3A and B illustrate the window frame of FIGS. 2A and B with substrates placed therein.
Figure 3B:
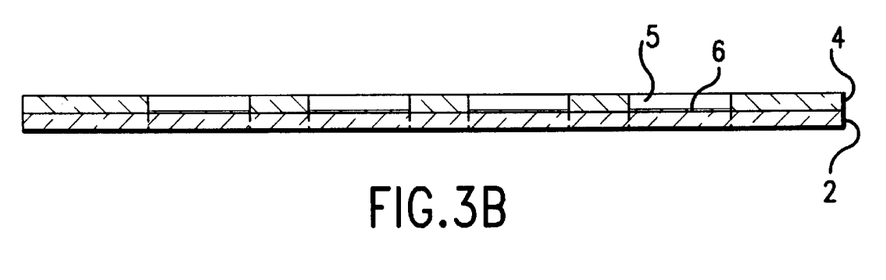

As best depicted by FIGS. 3A and 3B, where 3A is a top view and 3B is a side view, the substrates or substrate packages 5 are placed within the openings of the alignment frame 4 with the attach side facing up. Suitable substrate materials include multi-chip or single chip circuits comprised of laminated copper (power/ground and signal layers) interspersed with dielectric material. In one embodiment, thin organic material chip substrates are cut from a panel to form individual substrates. Any suitable dielectric material can be used in the present invention, such as, but not limited to, polyimides and polyimide laminates, epoxy resins, epoxy resins in combination with other resin material, organic materials, alone or any of the above combined with fillers. Preferred dielectric materials include a fluoropolymer matrix, where the fluoropolymer can be PTFE, ePTFE or copolymers or blends. Suitable fluoropolymers include, but are not limited to, polytetrafluoroethylene or expanded polytetrafluoroethylene, with or without an adhesive filler mixture.

Preferred materials include Speedboard® bond plies available from W. L. Gore and Associates, Inc., such as, Speedboard® C which is a prepreg of non-woven material containing a cyanate ester resin in a polytetrafluoro-ethylene matrix. Speedboard® C has a dielectric constant, Dk of is 2.6–2.7 at 1 MHz–10 GHz, a loss tangent of 0.004 at 1 MHz-10 GHz, a dielectric strength greater than 1000 V/mil, a glass transition ($T_g$) of 220° C., a resin content of 66–68 wt. % and is available in a variety of thicknesses. Also Speedboard® N prepregs, which is a prepeg of a non-woven material containing a multi-functional epoxy adhesive, in an expanded PTFE matrix may also be used.

Figure 7:
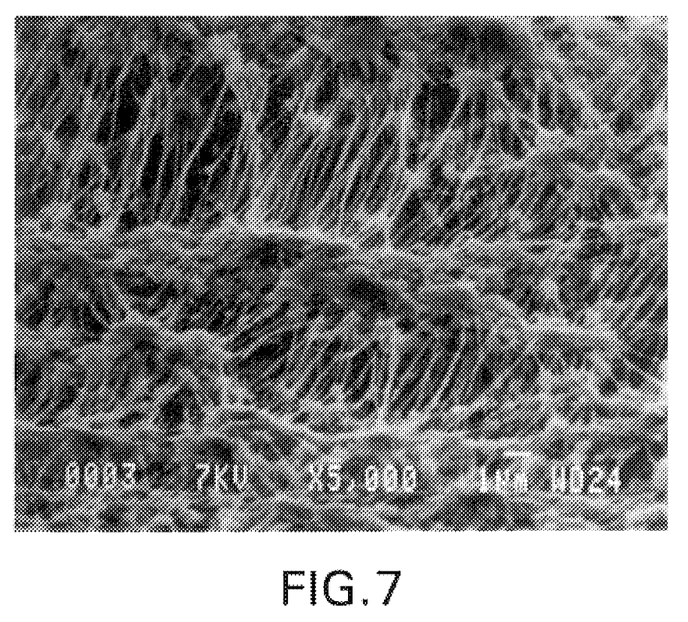
FIG. 7 is an electron microscope photograph of expanded polytetrafluoroethylene ("PTFE") showing the node fibril structure.

Speedboard® N has a dielectric constant, (Dk) of is 3.0 at 1 MHz, a loss tangent of 0.02 at 1 MHz, a dielectric strength greater than 900 V/mil, a glass transition and a $T_g$ of 140° C., a resin content of 66–68 wt. % and is available in a variety of thicknesses. Another dielectric is an expanded PTFE matrix, shown in FIG. 7, that includes a mixture of at least two of a cyanate ester compound, an epoxy compound, a bis-triazine compound and a poly (bis-maleimide) resin. For example, a varnish solution is made by mixing 5.95 pounds of M-30 (Ciba Geigy), 4.07 pounds of RSL 1462 (Shell Resins, Inc.), 4.57 pounds of 2, 4, 6-tribromophenyl-terminated tetrabromobisphenol A carbonate oligomer (BC-58) (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths –20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web any be any desired thickness, such as 25 µm, 40 cm or thickener. A 25 µm thick material has a mass of approximately 0.9 g and a weight per area of approximately 11.2 to 13.8 g/m$^2$ Other classes of dielectric materials include those where a porous matrix system contains an imbibed or impregnated adhesive-filler mixture. The porous matrix is a non-woven substrate that is imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 to Gore and 4,482,516 to Bowman, et al., each of which is incorporated herein by reference. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer. Alternatively, another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made prepared by paste extrusion and incorporating sacrificial fillers, porous inorganic or organic foams, microporous cellulose acetate, can also be used. The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles.

The filler comprises a collection of particles when analyzed by a Microtrak® Model FRA Partial Analyzer device, which displays a maximum particle size, a minimum particle size and an average particle size by way of a histogram. Suitable fillers to be incorporated into the adhesive $BaTiO_2$, $SiO_2$, $Al_2O_3$, ZnO, $ZrO_2$, $TiO_2$, precipitated and sol-gel silicas, non-conductive carbon (carbon black) and mixtures thereof. Especially preferred fillers are $SiO_2$, $ZrO_2$, $TiO_2$ alone or in combination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by using coupling agents. Suitable coupling agents include, silanes, titanates, zirconates, and aluminates. Suitable silylating agents may include, but are not limited to, functional silyating agents, silizanes, disilazanes, siloxanes. Suitable silazanes includes hexamethyidisilazane (Huls H730) and hexamethylcyclotrisilazane, silylamides such as bis (trimethylsilyl)acetamide (Huls B2500), silylureas such as trimethylsilylurea, and silylmidazoles as such as trimethylsilylimidazole. Titanates coupling agents are exemplified by the tetra alkyl type, coordinate type, chelate type, quaternary salt type, Tyzor® TOT {tetrakis(2-ethyl-hexyl) titanate, Tyzor®& TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl (diallyl)oxy, tri(dioctyl)pyro-phosphato titanate. Suitable zirconates include, any of the zirconates detailed at page 22 in the Kenrich catalog, in particular KZ 55-tetra (2,2 diallyloxymethyl)butyl, di(ditridecyl)phosphito zirconate, NZ-01-neopentyl(diallyl)oxy, trineodecanoyl zirconate, NZ-09-neopentyl(diallyl)oxy, tri(dodecyl)benzene-sulfonyl zirconate. The aluminates that can be used in the present invention include, but are not limited to Kenrich®, diisobutyl(oleyl)acetoacetyl aluminate (KA301), diisopropyl(oleyl)acetoacetyl aluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polydiborane, acetylene-terminated polyimide, polybutadiene, cyclic olefinic polycyclobutene and functionalized copolymers thereof, polysiloxanes, poly sisqualoxane, functionalized polyphenylene ether, polyacrylate, novolak polymers and copolymers, fluoropolymers and copolymers, melamine polymers and copolymers, poly(bis phenycyclobutane) and blends thereof. It should be understood that the aforementioned adhesives may themselves be blended together or blended with other polymers or additives, so as to impact flame retardancy or enhanced toughness.

As used herein Mean Flow Pore Size and minimum pore size were determined using the Coulter® Porometer II (Coulter Electronics Ltd., Luton UK) which reports the value directly. Average particle size and largest particle size were determined using a Microtrac light scattering particle size analyzer Model No. FRA (Microtrac Division of Leeds & Northup, North Wales, Pa., USA). The average particle size (APS) is defined as the value at which 50% of the particles are larger than. The largest particle size (LPS) is defined as the largest detectable particle on a Microtrac histogram Alternatively, the largest particle size is defined at the minimum point when the Microtrak FRA determines that 100% of the particles have passed.

ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

| Sample | Substrate Pore Size | | Particle Size | | MFPS ÷ Part$_{Avg}$ | Pore$_{min}$ ÷ Part$_{Max}$ | Pore$_{Min}$ ÷ Part$_{Avg}$ | Result |
|---|---|---|---|---|---|---|---|---|
| | Min (μm) | MFPS (μm) | Avg (μm) | Max (μm) | | | | |
| A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good |

In general, the method for preparing the adhesive-filler dielectric involves: (a) expanding a polytetrafluoroethylene sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, pressure feeding, the adhesive-filler paste into the highly porous scaffold, such as expanded polytetrafluoroethylene.

To prepare the filled adhesive material of this invention, particulate filler is mixed into a solvent or aqueous solution or molten adhesive to afford a finely dispersed mixture. The filler in small particle form is ordinarily less than 40 microns in size, and preferably has an average particulate size between 1 and 10 microns. The mean pore size of the node-and-fibril structure of the polytetrafluoroethylene should be large enough to allow for adequate penetration of the particulate. If the substrate is to be expanded polytetrafluoroethylene, then structures similar to those taught in U.S. Pat. No. 4,482,516 to Bowman, et al. are desirable. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer. Alternatively, another mechanism for gauging relative pore and particle sizes may be calculated as the smallest pore size being not less than about 1.4 times the largest particle size. Table 1 shows the effect of the relationship of the substrate mean flow pore size (MFPS) and particulate size. When the One example of the ceramic adhesive-filler dielectric composites is the following. A fine dispersion was prepared by mixing 281.6 g TiO$_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible, partially cured composite. The partially-cured adhesive composite thus produced comprised of 57 weight percent TiO$_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 μm (0.0039"(3.9 mil)) dielectric laminate thickness.

A second example of the ceramic adhesive-filler dielectric composites is the following. A fine dispersion was prepared by mixing 386 g SiO$_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible, partially cured composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent SiO$_2$, 5 weight percent PTFE and 42 weight percent adhesive, displayed good adhesion to copper, dielectric constant (at 10 GHz) of 3.3 and dissipation factor (at 10 GHz) of 0.005.

A third example of the ceramic adhesive-filler dielectric composites is the following. A fine dispersion was prepared by mixing 483 g $SiO_2$ (HW-11-89, Harbison Walker Corp.) into a manganese-catalyzed solution of 274.7 g bismaleimide triazine resin (BT206OBJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible, partially cured composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent $SiO_2$, 4 weight percent PTFE and 39 weight percent adhesive, displayed good adhesion to copper, dielectric constant (at 10 GHz) of 3.2 and dissipation factor (at 10 GHz) of 0.005.

A fourth example of the ceramic adhesive-filler dielectric composites is the following. A fine dispersion was prepared by mixing 15.44 kg $TiO_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" $TiO_2$-filled expanded PTFE (filled according to the teachings of Mortimer U.S. Pat. No. 4,985,296, except to 40% loading of $TiO_2$ and the membrane was not compressed at the end) was then dipped into the resin mixture, removed, and then dried at 165° C. for 1 min. under tension to afford a flexible, partially cured composite. The partially cured adhesive composite thus produced comprised of 70 weight percent $TiO_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008. A particularly preferred adhesive filler dielectric relies upon the use of a spherically shaped $SiO_2$ filler that is prepared by vapor metal combustion and available from Tatsumori LTD.

Figure 8:
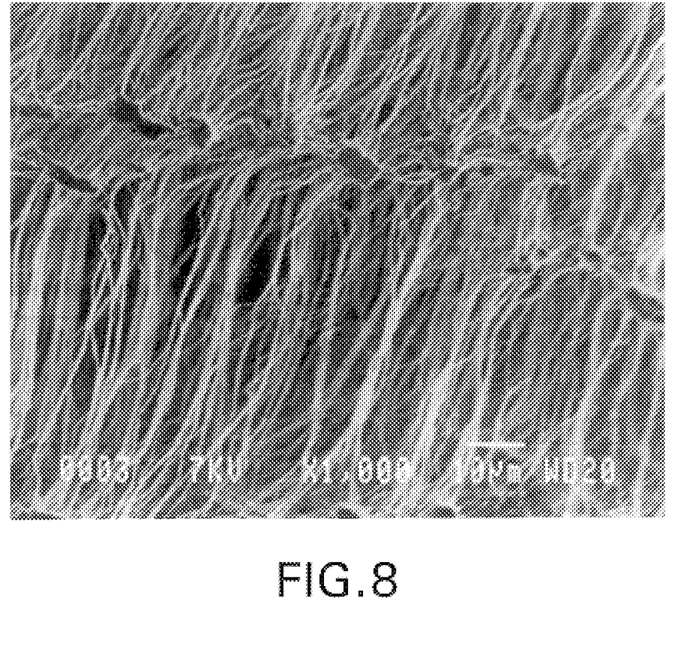
FIG. 8 is an electron microscope photograph of an expanded PTFE web showing the node fibril structure.

A fifth example of the ceramic adhesive-filler dielectric composites is the following. A fine dispersion was prepared by mixing 7.35 kg $SiO_2$ (ADMATECHS SO-E2, Tatsumori LTD) with 7.35 kg MEK and 73.5 g of coupling agent, i.e.,3-glycidyloxypropyltri-methoxysilane (Dynasylan GLYMO (Petrach Systems). To this dispersion was added 932 g of a 50% (w/w) solution of a cyanated phenolic resin, Primaset PT-30 (Lonza Corp.). In MEK, 896 g of a 50% (w/w) solution of RSL 1462 (Shell Resins, Inc.(CAS #25068-38-6)) in MEK, 380 g of a 50% (w/w) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w). The fine dispersion was poured into an impregnation bath. An expanded polytetrafluoro-ethylene web having the node fibril structure of FIG. 8, and the following properties was impregnated:

| | |
|---|---|
| Frazier | 20.55 $cf^3/min/ft^2$ |
| Surface Area | 9 $g/m^2$ |
| Ball Burst | 3.2 lbs |
| Thickness | 6.5 mil |
| Mean Flow Pore Size | 9.0 microns |

The Frazier number relates to the air permeability of the material being assayed. Air permeability was measured by clamping the web in a gasketed fixture which was provided with a circular area of approximately 6 square inches for air flow measurement. The upstream side was connected to a flow meter in line with a source of dry compressed air. The downstream side of the sample fixture was open to the atmosphere. Testing was accomplished by applying a pressure of 0.5 inches of water to the upstream side of the sample and recording the flow rate of the air passing through the in-line flowmeter (a ball-float rotameter that was connected to a flow meter. The Ball Burst Strength is a test that measures the relative strength of samples by determining the maximum at break. The web was challenged with a 1 inch diameter ball while being clamped between two plates. The Chatillon, Force gauge Ball/Burst Test was used. The media is placed taut in the measuring device and pressure affixed by raising the web into contact with the ball of the burst probe. Pressure at break is recorded. The ePTFE web was passed through a constantly agitated impregnation bath at a speed at or about 3 ft./min, so as to insure uniformity. The impregnated web was immediately passed through a heated oven to remove all or nearly all the solvent, and partially cure the adhesive and was collected on a roll. Several plies of this prepreg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.085 (10 GHz).

A sixth example of the ceramic adhesive-filler dielectric composites is the following. An ePTFE matrix containing an impregnated adhesive filler mixture, based on $SiO_2$ prepared from the vapor combustion of molten silicon was prepared from precursor solutions. Two precursor mixtures were initially prepared. Mixture I was in the form of a slurry containing a silanated silica similar to that of Example 5, where the silica contains a coating of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container. Mixture II comprises the desired resin blended in an MEK based solution containing an uncatalyzed resin blend (the adhesive) containing approximately 60% solids, where the solid portion is an exact mixture of 41.2% PT-30 cyanate ester resin, 39.5% RSL 1462 epoxy resin, 16.7% BC-58 flame retardant, 1.5% Irganox 1010, and 1% bisphenol A co-catalyst, all percentages by weight. Into a ten gallon container, 14.8 pounds of PT-30 and 15–20 pounds of MEK were added and stirred vigorously to completely solvate the PT-30. Then 6 pounds of BC-58 were measured and added to the MEKIPT-30 solution and vigorously agitated to solvate the BC-58. The stabilizer, 244.5 grams of Irganox 1010 and bisphenol A, 163 grams was added. The ten gallon container was reweighed and 14.22 pounds of RSL 1462 was added. Additional MEK was added to bring the solution weight to 60 pounds. The contents were then vigorously agitated for approximately 1 to 2 hours, or as long as necessary to completely dissolve the solid components. The desired product is a mixture of the silanated or titanated silica slurry, the uncatalyzed resin blend, and MEK in which 68% by weight of the solids are silica, and the total solids are between 5% and 50% by weight of the solution. The exact solids concentration varies from run to run, and depends in part on the membrane to be impregnated. The catalyst level is 10 ppm relative to the sum of the PT-30 and RSL 1462. The solid contents of mixtures I and II were determined to verify the accuracy of the precursors and compensate for any solvent flash that had occurred. Then mixture I was added to a ten gallon container to provide 12 pounds of solids, e.g., 51% solids content, 23.48 pounds of solution I. Then mixture II was added to the container to provide 5.64 pounds of solids, e.g., 59.6% solids (9.46 pounds of mixture II). The manganese catalyst solution (0.6% in mineral spirits), 3.45 grams, was added to mixture I and mixture II and blended thoroughly to form a high solids content solution. The bath solution for impregnating an ePTFE matrix, 28% solids solution, was prepared by adding sufficient MEK to the high solids content solution to a total weight of 63 pounds. Thereafter, an ePTFE matrix was impregnated with this bath solution to form a dielectric material.

A seventh example of the ceramic adhesive-filler dielectric composites is the following. A fine dispersion was prepared by mixing 26.8 g Furnace Black (SpecialSchwarz 100, Degussa Corp, Ridgefield Park, N.J.) and 79.8 g of coupling agent (GLYMO CAS #2530-83-8); 3-Glycidyloxypropyltrimethoxysilane. The dispersion was subjected to ultrasonic agitation for 1 minute, then 17.5 pounds ofSiO$_2$ (SO-E2) in 17.5 pounds of MEK were added. The dispersion was heated with constant overhead mixing for 1 hour at reflux, then allowed to cool to room temperature. Separately, an adhesive varnish was prepared by adding the following: 3413 g of a 57.5% (w/w) solution of Primaset PT-30 in MEK, 2456 g of a 76.8% (w/w) solution of RSL 1462 in MEK, 1495 g of a 53.2% (w/w) solution of BC-58 in MEK, 200 g of 23.9% (w/w) solution of bisphenol A in MEK, 71.5 g Irganox 1010, 3.21 g of a 0.6% (w/w) solution of Mn HEX-CEM in mineral spirits, and 2.40 kg MEK. In a separate container, 3739 g of the dispersion described above was added, along with 0.0233 g of Furnace Black (SpecialSchwarz 100), 1328 g of the adhesive varnish described above and 38.3 lbs MEK. This mixture was poured into an impregnation bath, and an e-PTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll. Several plies of this prepreg were laid up between copper foil and pressed at 200 psi in a vacuum-assisted hydraulic press at temperature of 220° C. for 90 minutes then cooled under pressure. This resulting dielectric displayed good adhesion to copper.

An eighth example of the ceramic adhesive-filler dielectric composites is the following. An adhesive varnish was prepared by adding the following: 3413 g of a 57.5% (w/w) solution of Primaset PT-30 (PMN P-88-1591) in MEK, 2456 g of a 76.8% (w/w) solution of RSL 1462 in MEK, 1495 g of a 53.2% (wlw) solution of BC-58 in MEK, 200 g of 23.9% (w/w) solution of bisphenol A in MEK, 71.5 g Irganox 1010, 3.21 g of a 0.6% (w/w) solution of Mn HEX-CEM in mineral spirits, and 2.40 kg MEK. In a separate container, 1328 g of the adhesive varnish described above, 42.3 lbs MEK, 6.40 g of Furnace Black (SpecialSchwarz 100), and 1860 g SiO$_2$ (SO-E2) were added. This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll. Several piles of this prepreg were laid up between copper foil and pressed at 200 psi in a vacuum-assisted hydraulic press at temperature of 220° C. for 90 minutes then cooled under pressure. This resulting dielectric displayed good adhesion to copper.

Figure 4A:
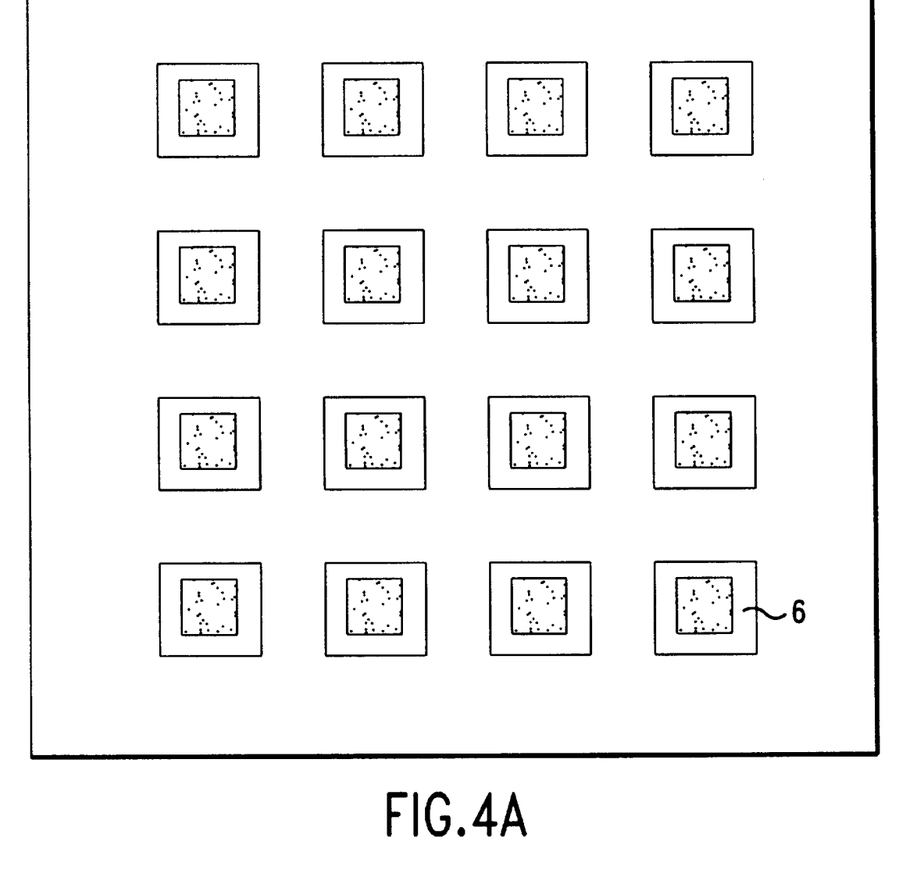
FIGS. 4A and B illustrate how adhesives may be applied onto the substrates.
Figure 4B:
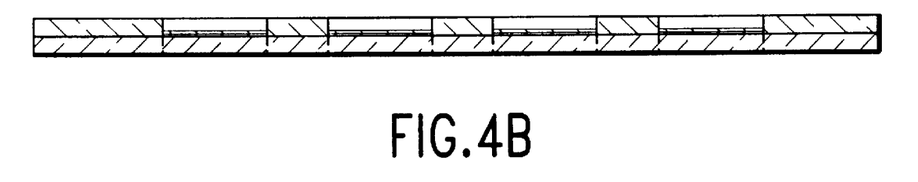
Figure 5A:
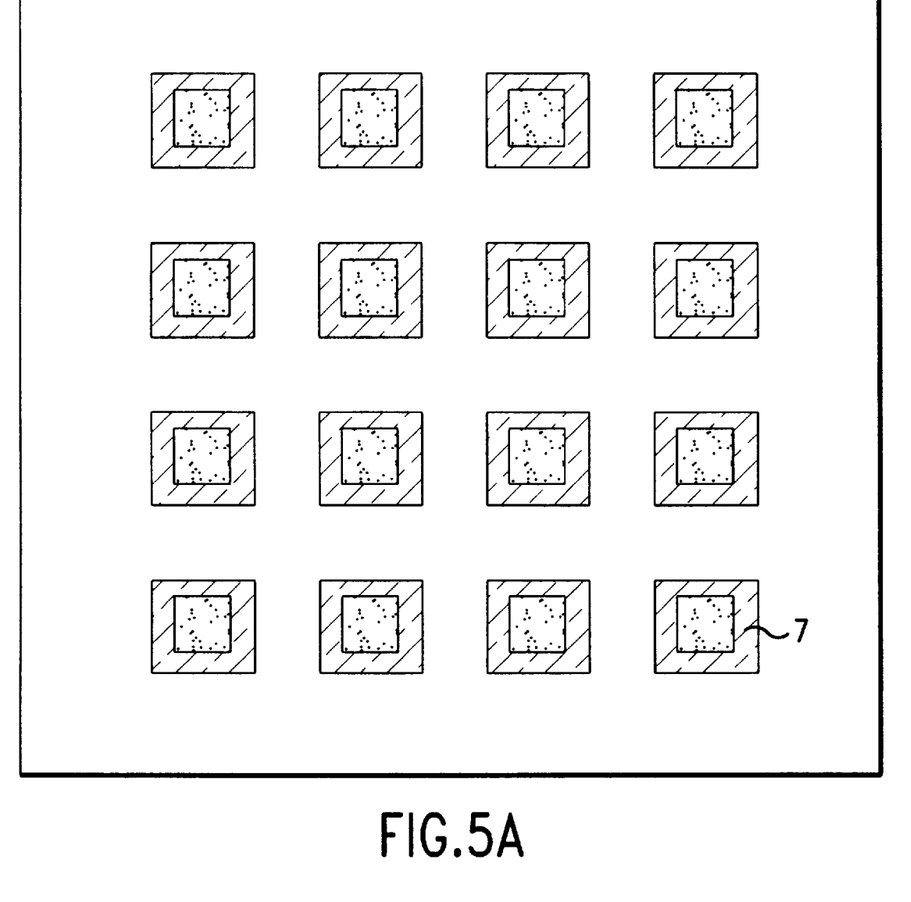
FIGS. 5A and B illustrate how stiffeners may be placed on top of each adhesive layer.
Figure 5B:
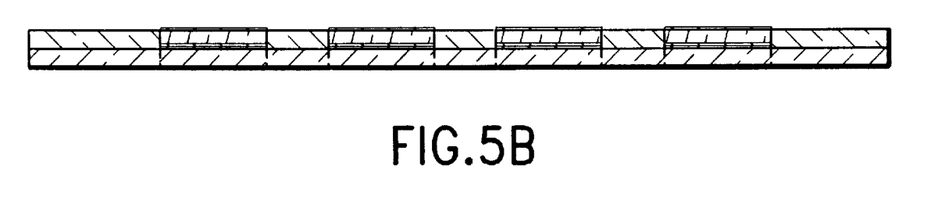

Referring back to the steps of producing the chip package as shown in FIGS. 4A and 4B, where 4A is a top view and 4B is a side view, the adhesive 6 is sized so that it may be placed within the openings of the alignment frame 4 and atop the substrates 5. And, as shown in FIGS. 5A and 5B, where 5A is a top view and 5B is a side view, the stiffener 7 is then placed within the openings of the alignment frame 4 and atop the adhesive 6. The adhesive 6 serves to bond substrates 5 to stiffener 7. The preforming of the adhesive to the correct dimensions may be accomplished by any suitable means such as lasering or mechanically punching. Suitable adhesives include Ablestik 564A conductive adhesive (manufactured by Ablestik Co. of Rancho Dominguez, Calif.) and should be sized such that the resultant flow of adhesive resin will not penetrate into cavity openings in the stiffener or spreader. In one embodiment, the difference in size must be at least 0.020" per side of a cavity opening.

Suitable stiffeners include solid metal (typically copper) material or laminated structures, with or without cavities, used to enhance the flexural modulus, or rigidity of the substrate or substrate package. In one embodiment, a metal or laminate whose coefficient of thermal expansion is equal to or less than that of the substrate or substrate package to maximize flatness of the finished product is selected. Stiffeners referred herein also include heat spreaders which are typically solid metal (typically copper) material, with or without cavities, used to efficiently conduct heat from the substrate or substrate package as well as enhance the flexural modulus, or rigidity of the substrate or substrate packrate or substrate package using an electrically or thermally conductive adhesive. The substrate, adhesive and stiffener form a chip package.

As again illustrated by FIG. 6, a sheet of an interface material 8 such as skived PTFE is placed atop the stiffener 7. In one embodiment, the top half of the vacuum frame is then lowered onto the bottom half and secured in place with a latch. As illustrated in FIG. 6, the top half of the frame is hinged to the bottom and includes two vacuum ports. The bottom half of the frame contains one sealed thermocouple connection.

In one embodiment, the frame is then placed in a reusable vacuum bag such as one made by Zip-Vac of Auburn, Washington. A reusable vacuum frame, which is also referred to as a "vacuum bag," is typically made of silicone rubber attached to aluminum. Vacuum is then applied to the frame. The amount of vacuum being applied is determined by the type of adhesive being used. For example, Ablestik conductive adhesives require a minimum of about 6"Hg (3 psi).

After reaching the desired vacuum, the vacuum frame is then placed in a oven and baked for a predetermined period of time based on the adhesive being used. Ablestik conductive adhesives require a minimum cure time of about 1 hour at or above about 150° C.

Any alternative method of applying pressure and heat to cure the adhesive and thus, bond the stiffener to the substrate may be employed. Such alternative methods include placing in an oven while applying pressure, for example, from a weight or press.

When the oven cure cycle is complete, the vacuum bag is removed from the oven and allowed to cool under vacuum until it can be easily handled, typically ½ hour. The vacuum is then shut off to the frame. The frame is opened and the interface material 8 atop the components is discarded. The alignment frame 4 is removed from the vacuum frame. Finally, the bonded packages are removed from the alignment frame openings.

The bonding process of the present invention results in organic packages having a demonstrated overall flatness of less than 25 μm (0.001"). Moreover, the substrate to stiffener adhesion has been shown to be greater than 200 psi following 170 hours of pressure pot exposure (1 atmosphere of gauge pressure @ 100% humidity and 121° C.).

In another embodiment of the present invention, the stiffener is aligned and laminated to the substrate by the method referred herein as tack bonding.

Figure 1:
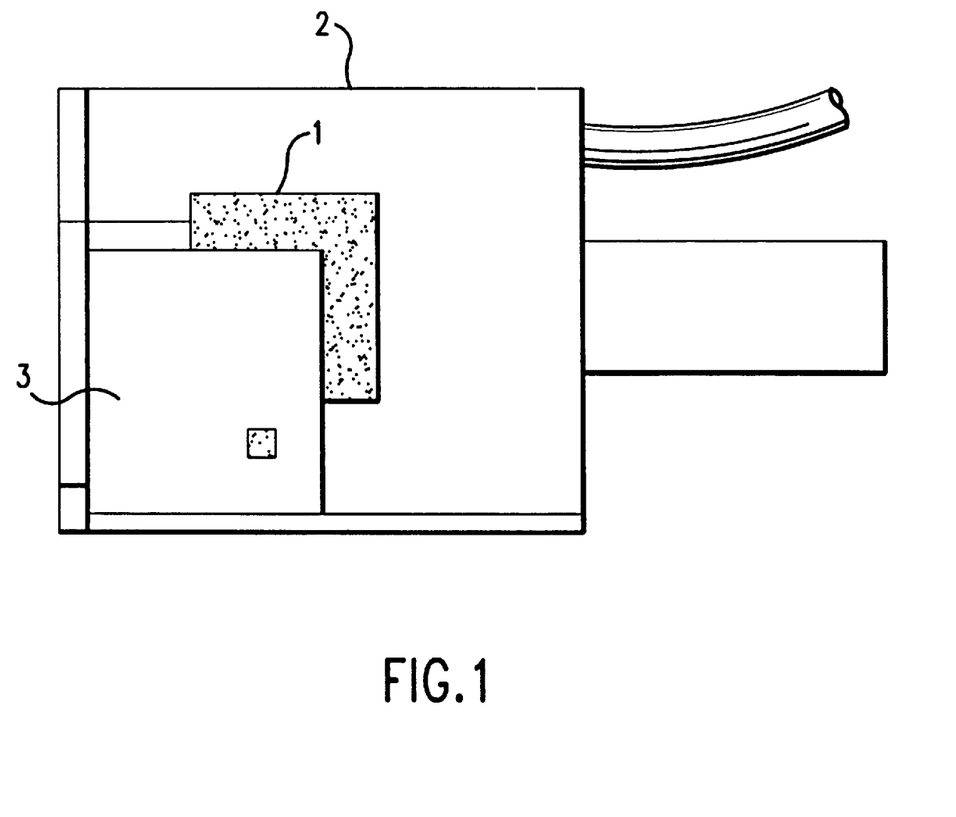
FIG. 1 is a top view and illustrates an L-shaped alignment frame used in one embodiment of the tack bonding method of the present invention.

FIG. 1 illustrates one embodiment of the tack bonding method of the present invention. In this embodiment, an L-shaped alignment tool 1 is employed rather than an alignment frame. This method is referred to herein as the edge align method. The interface material, as discussed above, is placed on a platform 2 to protect the surface of the substrate. A substrate, as discussed above, is placed face down (i.e., that the surface attach area is exposed) on the heated metal platform 2 and aligned against two sides of the platform in the area shown as item 3. A tool such as an L-shaped piece of metal 1 is placed against the other two sides of the substrate to hold it in an aligned fashion. An adhesive such as Ablestik™, as discussed above, is placed on the substrate. A stiffener is then placed on the adhesive.

The L-shaped alignment tool 1 is then secured. In one embodiment, the platform has a hole therein under the area where the L-shaped alignment tool 1 rests. One method of securing the tool 1 to the platform 2 is by applying vacuum from the platform 2 to the bottom of the tool 1. Heat is also applied to the platform 2 and is transferred to the substrate.

Subsequently, heat and pressure is applied to the package containing the substrate, adhesive and stiffener. The amount of pressure to apply, the amount of time to apply the pressure, and the amount of heat to apply is based on the adhesive and the geometry of the package being used and the method employed. For example, when tacking a chip package comprising a solid copper stiffener with dimensions of 3" by 2.25" by 0.062" thick, circuit dimensions of 2.5" by 1.4" by 0.016" thick, and for Abelstik 564A conductive adhesive having the same area dimensions as the circuit with 0.005" thick, the pressure is about 33 lbs. over the area of the package, about 150° C., and about 7 seconds to adhere the stiffener to the substrate and thus, forms a "tacked" package.

In another embodiment of the present invention, a tack bonding apparatus includes a pneumatic press having a heated platform and a heated ram. The heated platform includes two side edges which are used to align the package. To tack the package, the heated ram is lowered onto the package and a predetermined pressure is applied for a predetermined time.

The package is then removed from the platform 2 and cooled. One method of cooling is to place on a palette which is water cooled to cool the bonded package.

Subsequently, the package is bonded that results in permanently laminating (bonding) the stiffener to the substrate. One method of bonding is to place the package in a vacuum bag. For example, pressure (about 3 to 12 psi) and heat (about 150° C.) is applied to permanently bond the stiffener to the substrate by curing the adhesive.

Compared to the bonding method discussed above, the tack bonding method of the present invention may have the following advantages. Since the time is minimized to tack the stiffener to the substrate, the amount of time, which the alignment frame and/or edge align apparatus are occupied, is minimized. Additionally, after the tacking step, many packages may be cured together in a large oven without the space concerns related to using alignment frames and/or edge align apparatus.

The tack bonding method of the present invention also has advantages over the previous pressure tacking methods. In those methods, a pressure sensitive adhesive was used and pressure was applied to the package so as to tack the stiffener to the substrate. The disadvantage of this prior method included the limitation of the types of adhesive that could be employed. In contrast, the tack bonding method, in accordance with the present invention, does not limit the type of adhesive to employ. Accordingly, an adhesive may be chosen to match the specific requirements of the final application, e.g. high bond strength, high thermal stability, improved moisture resistance, match the CTE, electrical and/or thermal conductivity and/or higher glass transition temperature.

In another embodiment of the present invention, an alignment frame may be used in the tack bonding method. In this method, an alignment frame, as discussed above, is utilized instead of the L-shaped alignment tool discussed above. Again, minimum heat and pressure for a minimum time are applied to the package to tack the stiffener to the substrate.

In a further embodiment of the present invention, the L-shaped alignment tool may be used in the bonding method described above. In this method, an L-shaped alignment tool, as discussed above, is utilized instead of an alignment frame discussed above. Other than this modification, the same bonding method is used that is detailed above.

In yet another embodiment of the present invention, a pin alignment method may be used in either the tack bonding or bonding method of the present invention. Other than the method of alignment detailed below, the same method is utilized for tack bonding and bonding as discussed above.

The pin alignment method may be employed in those applications where a stiffener contains tooling holes. In those applications that also employ a substrate having tooling holes, there is no need for an alignment frame or an alignment tool. Instead, holes are made in the adhesive to match the tooling holes and pins are inserted in the tooling holes which result in proper alignment of the chip package. Subsequently, the package may be tack bonded or bonded according to the method described herein.

In those applications where the stiffener has tooling holes but the substrate does not have tooling holes, an alignment frame or alignment tool is also employed. The alignment frame or tool has tooling holes that match the tooling holes of the stiffener. Pins are inserted into the tooling holes of the stiffener. The alignment frame or tool is then inserted over the corresponding pins in the stiffener. The adhesive and substrate are placed within the alignment frame or tool as illustrated in FIGS. 4A and 4B. Subsequently, the chip package is either tack bonded or bonded by the method of the present invention.

While particular embodiments of the present invention have been illustrated and described herein, the present invention should not be limited to such illustrations and descriptions. It should be apparent that changes and modifications maybe incorporated and embodied as part of the present invention within the scope of the following claims.

Having described the invention, what is claimed is:

1. A method for aligning and laminating a substrate to a stiffener to form an integrated circuit chip package, said method comprising the following steps:
   a) Providing at least one substrate comprised of a conductor interspersed with dielectric material;
   b) providing a stiffener;
   c) providing an alignment frame having a coefficient of thermal expansion that is equal to or less than said stiffener or said substrate;
   d) placing the substrate within the alignment frame;
   e) applying an adhesive on the substrate within the alignment frame;
   f) placing the stiffener on the adhesive to form an integrated circuit chip package within the alignment frame; and
   g) applying sufficient pressure and heat based on the type of adhesive and geometry of the integrated circuit chip package for a sufficient time so as to cure the adhesive whereby the stiffener enhances rigidity of the package.

2. A method for aligning and laminating a substrate to a stiffener to form an integrated circuit chip package, said method comprising the following steps:
   a) providing at least one substrate comprised of a conductor interspersed with dielectric material;
   b) providing a stiffener;
   c) providing an L-shaped alignment tool having a coefficient of thermal expansion that is equal to or less than said stiffener or said substrate;
   d) placing the substrate within the L-shaped alignment tool;
   e) applying an adhesive on the substrate within the L-shaped alignment tool;
   f) placing the stiffener on the adhesive to form an integrated circuit chip package within the L-shaped alignment tool; and
   g) applying sufficient pressure and heat based on the type of adhesive and geometry of the integrated circuit chip package for a sufficient time so as to cure the adhesive whereby the stiffener enhances rigidity of the package.

3. A method for aligning and laminating a substrate to a stiffener to form an integrated circuit chip package, said method comprising the following steps:
   a) providing at least one substrate comprised of a conductor interspersed with dielectric material;
   b) providing a stiffener;
   c) applying an adhesive on the substrate where the adhesive and substrate have tooling holes;
   d) placing the stiffener on the adhesive to form an integrated circuit chip package where the stiffener has tooling holes;
   e) inserting pins into the tooling holes of the substrate, adhesive and stiffener so as to align the layers; and
   f) applying sufficient pressure and heat based on the type of adhesive and geometry of the integrated circuit chip package for a sufficient time so as to cure the adhesive whereby the stiffener enhances rigidity of the package.

4. A method for aligning and laminating a substrate to a stiffener to form an integrated circuit chip package, said method comprising the following steps;
   a) providing at least one substrate comprised of a conductor interspersed with dielectric material;
   b) providing a stiffener;
   c) providing an alignment frame having a coefficient of thermal expansion that is equal to or less than said stiffener or said substrate;
   d) placing the substrate within the alignment frame;
   e) applying an adhesive on the substrate within the alignment frame;
   f) placing the stiffener on the adhesive to form an integrated circuit chip package within the alignment frame;
   g) applying sufficient heat and pressure to the integrated circuit chip package for a sufficient time to tack the stiffener to the substrate;
   h) removing the integrated circuit chip package from the alignment frame; and
   i) subsequently, heating the integrated circuit chip package for a sufficient time and temperature to cure the adhesive whereby the stiffener enhances rigidity of the package.

5. A method for aligning and laminating a substrate to a stiffener to form an integrated circuit chip package, said method comprising the following steps:
   a) providing at least one substrate comprised of a conductor interspersed with dielectric material;
   b) providing a stiffener;
   c) providing an alignment tool having a coefficient of thermal expansion that is equal to or less than said stiffener or said substrate;
   d) placing the substrate within the alignment tool;
   e) applying an adhesive on the substrate within the alignment tool;
   f) placing the stiffener on the adhesive to form an integrated circuit chip package within the alignment tool;
   g) applying sufficient heat and pressure to the integrated circuit chip package for a sufficient time to tack the stiffener to the substrate;
   h) removing the integrated circuit chip package within the alignment tool; and
   i) subsequently, heating the integrated circuit chip package for a sufficient time to cure the adhesive whereby the stiffener enhances rigidity of the package.

6. A method for aligning and laminating a substrate to a stiffener to form an integrated circuit chip package, said method comprising the following steps:
   a) providing at least one substrate comprised of a conductor interspersed with dielectric material;
   b) providing a stiffener;
   c) applying an adhesive on the substrate where the adhesive and substrate have tooling holes;
   d) placing the stiffener on the adhesive to form an integrated circuit chip package where the stiffener has tooling holes;
   e) inserting pins into the tooling holes of the substrate, adhesive and stiffener so as to align the layers;

f) applying sufficient heat and pressure to the integrated circuit chip package for a sufficient time to tack the stiffener to the substrate;

g) removing the pins from the integrated circuit chip package; and h) subsequently, heating the integrated circuit chip package for a sufficient time and temperature to cure the adhesive whereby the stiffener enhances rigidity of the package.

7. The method of claims 1, 2 or 3, 4, 5 or 6 wherein the pressure is applied by a vacuum bag.

8. The method of claims 1 or 4 wherein the frame is made of metal.

9. The method of claims 1, 2, 3, 4, 5 or 6 wherein the stiffener is a solid metal material with a coefficient of thermal expansion equal to or less than that of the substrate.

* * * * *